United States Patent [19]

Katakura et al.

[11] 4,422,051
[45] Dec. 20, 1983

[54] GAIN CONTROL CIRCUIT

[75] Inventors: Masayuki Katakura; Kenzo Akagiri, both of Yokohama, Japan

[73] Assignee: Sony Corporation, Tokyo, Japan

[21] Appl. No.: 286,243

[22] Filed: Jul. 23, 1981

[30] Foreign Application Priority Data

Jul. 28, 1980 [JP] Japan .................. 55-103322
Jul. 28, 1980 [JP] Japan .................. 55-103323

[51] Int. Cl.³ .......................... H03G 3/30; H03F 3/45
[52] U.S. Cl. .................................... 330/278; 330/254; 330/260
[58] Field of Search ............... 330/254, 278, 279, 260

[56] References Cited

U.S. PATENT DOCUMENTS

| 3,714,462 | 1/1973 | Blackmer | 307/229 |
| 3,757,240 | 9/1973 | Fogg | 330/254 |
| 3,789,143 | 1/1974 | Blackmer | 179/15.55 R |
| 3,911,371 | 10/1975 | Nakamura et al. | 330/28 |

Primary Examiner—James B. Mullins
Assistant Examiner—Gene Wan
Attorney, Agent, or Firm—Lewis H. Eslinger; Alvin Sinderbrand

[57] ABSTRACT

A gain control circuit particularly suitable for compressing or expanding the dynamic range of an audio signal, and thereby reducing noise produced during recording and playback comprises an input circuit receiving an input signal, first and second differential amplifiers each supplied from the input circuit with a signal derived from the input signal, with the amplifying elements of each being complementary to the amplifying elements of the other, a first pair of transistors having their emitters coupled to the output of the first differential amplifier and a second pair of transistors having their emitters coupled to the output of the second differential amplifier. The transistors of each pair are of the same conductivity type as the amplifying elements of the associated differential amplifier. The collectors of the transistors of each pair are jointed respectively to the collectors of the corresponding transistors of the other pair. Control voltage input terminals are respectively connected to one transistor of each pair and an opposite transistor of the other pair. A feedback signal is applied from the joined collectors of the one transistors to the input circuit, and an output current is applied from the joined collectors of the other transistors to an output stage which can include a load resistor or a current-to-voltage converter circuit. This arrangement prevents variation in total static current when gain is varied, thereby achieving a superior signal-to-noise characteristic.

17 Claims, 10 Drawing Figures

FIG. I
PRIOR ART
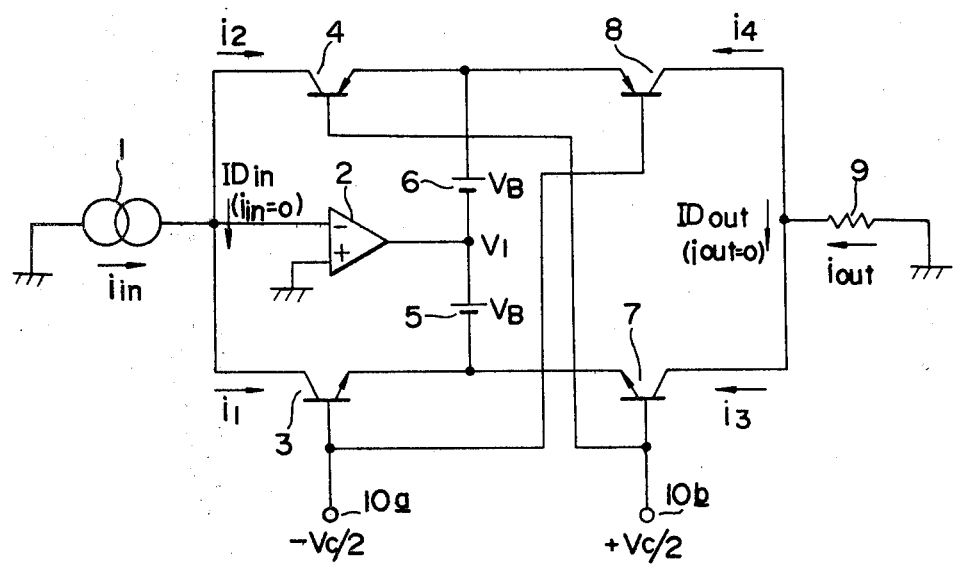
FIG. 2
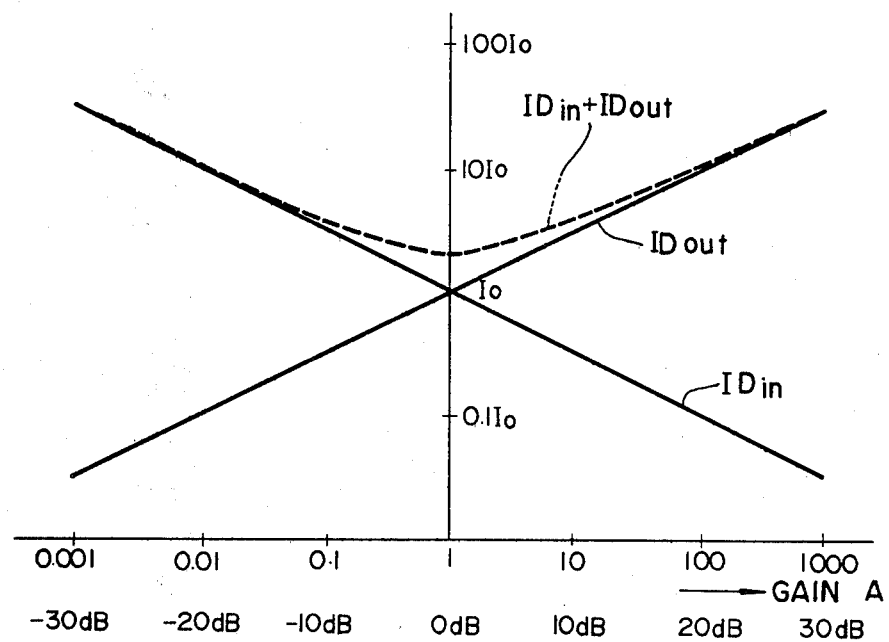

GAIN CONTROL CIRCUIT

BACKGROUND OF THE INVENTION

1. Field of the Invention

This invention relates to gain control circuits and is more particularly directed to a gain control circuit of the voltage-control type, wherein the gain thereof varies as an exponential function of a control voltage applied thereto.

2. Description of the Prior Art

Conventional gain control circuits for electrically controlling the circuit gain use small signal impedance changes to provide corresponding changes of bias voltage or current for non-linear elements, such as semiconductor diodes, bipolar transistors, or field-effect transistors. However, the control characteristics and input/output characteristics of these circuits are far less than is desirable for high fidelity audio equipment, and such circuits are generally unsuitable for use in an audio-signal noise-reduction circuit.

A voltage-control type gain control circuit having a higher performance characteristic has been proposed, for example, in U.S. Pat. No. 3,714,462 to David E. Blackmer. Such circuit takes advantage of the well-known exponential voltage-to-current characteristic of the base-emitter junction of a bipolar transistor. The circuit includes a log-converting transistor and an antilog-converting transistor. Unfortunately, the total static current flowing through these transistors varies greatly as a gain control signal applied thereto is varied, as will be described hereinafter in greater detail.

Because of the significant variations of the static current of such a circuit, a high static current is accompanied by adverse effects such as increased feed-through of the control signal, increased noise (mainly shot noise), and increased current consumption. Conversely, low static current is accompanied with such problems as the generation of crossover distortion. This occurs because of the reduction of the mutual conductance of transistor in the neighborhood of the zero crossing of the input current. Another adverse effect of low static current is the generation of non-linear distortion. This occurs because the operation of the feedback path and output path formed by the PNP and NPN complementarily conductive transistors approach class B operation when the collector-emitter current is low. Still further problems accompanying low static current are the restriction of bandwidth due to the reduction of the cut-off frequency of the transistors, and the instability of the bias circuit with respect to temperature and to source voltage fluctuations.

The actual static current in the prior art voltage-control type gain control circuit is thus selected as a compromise, or trade-off of the aforementioned opposite high- and low-static-current conditions. However, as aforesaid, the variations of the static current with changes of the gain are rather great. Consequently, the available range of selection mentioned above is unavoidably kept narrow. Furthermore, the aforementioned adverse effects cannot be avoided altogether, because of the wide fluctuations in static current that can occur.

OBJECTS AND SUMMARY OF THE INVENTION

Accordingly, it is an object of this invention to provide an improved gain control circuit capable of avoiding the above-mentioned defects of conventional circuits.

A more specific object of this invention is to provide a gain control circuit of the voltage-circuit type, in which the total static current is held at a constant value irrespective of any changed in the gain thereof as determined by a gain control voltage.

Consequently, it is a further object of this invention to provide a voltage-control type gain control circuit, in which the transistor cut-off frequency is reduced, thus increasing frequency response range, and reducing feed-through (i.e., leakage of the control signal) and noise (particularly shot noise), while achieving satisfactory linearity in the gain control characteristics and input/output characteristics thereof.

A still further object of the present invention is to provide a voltage-control type gain control circuit suitable for integration as a semiconductor integrated circuit and which is economically realizable on a small circuit scale by omitting an operational amplifier.

A yet further object of the present invention is to provide a voltage-control type gain control circuit having a low transistor cut-off frequency and a broad bandwidth frequency characteristic.

Another frequency object of the present invention is to provide a gain control circuit having a wide gain control range and a satisfactory linearity over that control range.

A yet still further object of.the present invention is to provide a gain control circuit having a satisfactory linear input/output characteristic, while being substantially free of significant distortion.

Another further object of the presdent invention is to provide a gain control circuit which avoids feed-through of the control signals.

A yet still further object of the present invention is to provide a gain control circuit in which noise, particularly shot noise, is substantially reduced.

In accordance with an aspect of the present invention, a gain control circuit of voltage control type comprises an input stage for receiving an input signal; a first differential amplifier having an input coupled to the input stage and first and second differential output terminals; a second differential amplifier having an input coupled to the input stage and first and second differential output terminals; a first pair of transistors of one conductivity type having emitters coupled together to the first differential output terminal of said first differential amplifier, and having respective bases and collectors; a second pair of transistors having an opposite conductivity type to that of the first pair, having emitters coupled together to the first differential output terminal of said second differential amplifier, and having collectors coupled so that the collector of one transistor of the first pair is coupled to the collector of one transistor of the second pair, and the collector of the other transistor of the first pair is coupled to the collector of the other transistor of the second pair, and having respective bases, the base of the one transistor in each pair being joined to the base of the other transistor of the remaining pair; a feedback circuit coupling the collectors of the one transistors to the input stage; a circuit joining the second differential output terminals of the first and second differential amplifiers to each other and to a common point; and an output circuit coupled to the collectors of the other transistors of the first and second pairs. Preferably, the differential amplifiers each include two transistors of the same conductivity type as that of the associated pair of transistors. In such arrangement the emitters thereof are coupled together to a constant current source, and the collectors of these transistors respectively provide the first and second differential output terminals. The bases thereof are connected to the input stage and to a reference point. The input stage can include an operational amplifier, which can be followed by a linearizing resistor.

The above and other objects, features, and advantages of the present invention will become readily apparent from the ensuing detailed description of illustrative embodiments of the invention, to be read in connection with the accompanying drawings.

BRIEF DESCRIPTION OF THE DRAWINGS

FIG. 1 is a circuit diagram showing a prior-art gain control circuit;

FIG. 2 is a graph showing the static current characteristics of the circuit of FIG. 1;

DETAILED DESCRIPTION OF THE PREFERRED EMBODIMENTS

Figure 3:
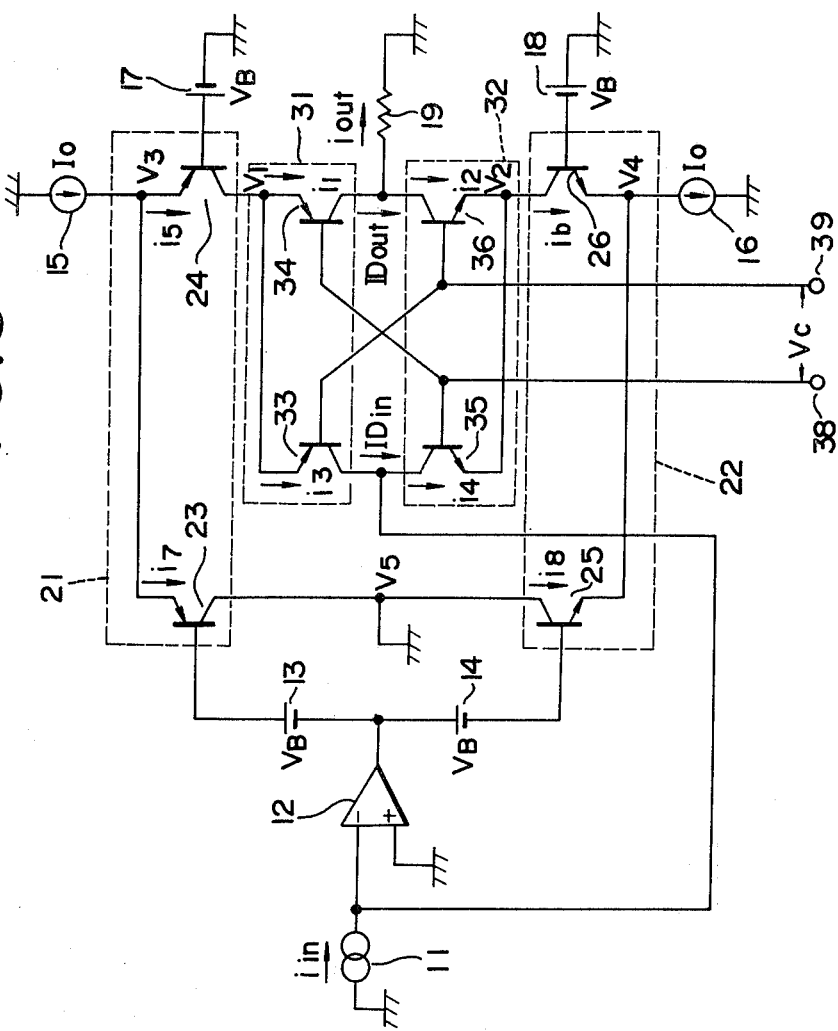
FIG. 3 is a circuit diagram showing a first embodiment of the present invention.

With reference initially to FIG. 1 of the accompanying drawings, a conventional gain control circuit will be described in detail for the purpose of emphasizing the advantageous features of this invention.

The conventional circuit, which is of the voltage-control type, has a logarithmic input/output characteristic, and is used as a variable-gain element in a noise-reduction circuit, for example, for use in the recording and playback of magnetic tapes or in the playing of audio records. An explanation of such noise reduction is contained, for example, in U.S. Pat. No. 3,789,143 to David E. Blackmer.

As shown in FIG. 1, the conventional gain control circuit includes an input signal source 1, here shown as a current source, coupled to an inverting input of an operational amplifier 2, whose non-inverting input is grounded. An NPN feedback transistor 3 and a PNP feedback transistor 4 have their collectors coupled to the inverting input terminal of the operational amplifier 2, and have their emitters respectively coupled through a negative bias voltage source 5 and a positive bias voltage source 6 to the output terminal of the operational amplifier 2. The transistors 3 and 4 provide a feedback current to the operational amplifier 2, which thereby acts as an error amplifier.

This conventional gain control circuit further includes an NPN output transistor 7 and a PNP output transistor 8. The emitters of the transistors 7 and 8 are respectively coupled to the emitters of the transistors 3 and 4. The collectors of the transistors 7 and 8 are joined together to one end of an output load resistor 9, whose other end is grounded. First and second control signal inputs 10a and 10b are respectively coupled to the bases of the transistors 3 and 8 and to the bases of the transistors 4 and 7. In this circuit a balanced control voltage $V_C$ is applied between the two control signal inputs 10a and 10b, so that a control voltage $(-V_C/2)$ is applied to the bases of the transistors 3 and 8, while a complementary control voltage $(+V_C/2)$ is applied to the bases of the transistors 4 and 7.

In the conventional gain control circuit of FIG. 1, the signal source 1 provides an input signal current $i_{in}$, and a resulting output current $i_{out}$ flows in the load resistor 9. Also, currents $i_1$, $i_2$, $i_3$, and $i_4$ flow through the collectors of the respective transistors 3, 4, 7, and 8. For any particular input signal current $i_{in}$, the operational amplifier 2 provides at its ouput terminal a voltage $v_1$. Each of the bias voltage sources 5 and 6 provides a bias voltage difference $V_B$.

If the base-emitter saturation current through each of the transistors 3, 4, 7, and 9 (being the same for each of the transistors) is expressed as $I_S$, and the unit electron charge, Boltzamnn's constant, and the absolute Kelvin temperature of the base-emitter junction are expressed as q, k, and T, respectively, the collector currents $i_1$, $i_2$, $i_3$, and $i_4$ can be expressed as follows:

$$i_1 = I_S \left[ \exp\left( \frac{q(V_B - V_C/2 - v_1)}{kT} \right) - 1 \right] \quad (1)$$

$$i_2 = I_S \left[ \exp\left( \frac{q(V_B - V_C/2 + v_1)}{kT} \right) - 1 \right] \quad (2)$$

$$i_3 = I_S \left[ \exp\left( \frac{q(V_B + V_C/2 - v_1)}{kT} \right) - 1 \right] \quad (3)$$

and $$i_4 = I_S \left[ \exp\left( \frac{q(V_B + V_C/2 + v_1)}{kT} \right) - 1 \right] \quad (4)$$

At normal temperature (T=300° K.) the expression kT/q is approximately equal to 26 mV.

Thus, the input current $i_{in}$ can be expressed $$i_{in} = i_1 + i_2 \quad (5)$$

$$= -2I_S \exp \frac{q(V_B - V_C/2)}{kT} \cdot \sinh \frac{qv_1}{kT}$$

Likewise, the output current $i_{out}$ can be expressed $$i_{out} = i_3 + i_4 \quad (6)$$

$$= -2I_S \exp \frac{q(V_B + V_C/2)}{kT} \cdot \sinh \frac{qv_1}{kT}$$

Thus, the relation between input and output currents can be expressed $$i_{out} = i_{in} \cdot \exp \frac{qV_C}{kT} \quad (7)$$

Consequently, the current gain of the conventional circuit of FIG. 1 varies as an exponential function of the control voltage $V_C$.

However, as will now be explained, in the circuit of FIG. 1, the static current, also called the idling current, which flows through the transistors 3, 4, 7, and 8 when there is no input signal (i.e., when $i_{in}=0$) varies significantly in amplitude as the gain control voltage $V_C$ is varied. In FIG. 1, and in the chart of FIG. 2, the static current through the feedback transistors 3 and 4 is represented by $ID_{in}$ while the static current through the output transistors 7 and 8 is represented by $ID_{out}$. The variation of the static currents $ID_{in}$ and $ID_{out}$ with the gain conrol voltage $V_C$ has adverse effects upon the characteristic of the conventional gain control circuit, as will be apparent from the following discussion.

When the input signal $i_{in}$ is zero, and, therefore, the output current $i_{out}$ is also zero, the static current $ID_{in}$ through the feedback path and the static current $ID_{out}$ through the output path can be respectively expressed as $$ID_{in} = i_1 = -i_2;$$

and $$ID_{out} = i_3 = -i_4.$$

Consequently, $$ID_{in} = I_S \left[ \exp\left\{ \frac{q(V_B - V_C/2)}{kT} \right\} - 1 \right] \quad (8)$$

$$\simeq I_S \exp\left\{ \frac{q(V_B - V_C/2)}{kT} \right\}$$

and $$ID_{out} = I_S \left[ \exp\left\{ \frac{q(V_B + V_C/2)}{kT} \right\} - 1 \right] \quad (9)$$

$$\simeq I_S \exp\left\{ \frac{q(V_B - V_C/2)}{kT} \right\}$$

The foregoing expressions can be shortened by using the symbols $I_0$ and $A$ defined as $$I_0 = I_S \exp(qV_B/kT)$$

and $$A \equiv \exp(qV_C/kT).$$

Here, A should be recognized as the current gain as shown in the equation (7). Thus, the expressions (8) and (9) can be rewritten as $$ID_{in} = I_0 \cdot A^{-\frac{1}{2}} \ldots \quad (10)$$

and $$ID_{out} = I_0 \cdot A^{+\frac{1}{2}} \ldots \quad (11)$$

Accordingly, the static current $ID_{in}$ and $ID_{out}$ through the feedback path and the output path respectively vary as a function of gain as shown in the solid line in FIG. 2. Accordingly, the sum of the static currents $ID_{in} + ID_{out}$, as represented by the dashed curve in FIG. 2 will vary from a value of $2I_0$ to a value of approximately 50 $I_0$. In other words, the ratio of the maximum value of the sum $ID_{in} + ID_{out}$ to the minimum value thereof is about 17 dB. Furthermore, the gain control circuit of the type shown in FIG. 1 has the disadvantage of unacceptably high-feed through of the control signal and an increased noise figure (mainly due to shot noise), and increased power consumption whenever the static current is high. Conversely, when the static current is low, the gain control circuit of FIG. 1 is subject to such problems as crossover distortion due to the reduction of mutual conductance of the transistors 3, 4, 7, and 8 at the neighborhood of the zero crossings of the input current $i_{in}$. Additionally, when the static current is low, non-linear distortion can occur because the feedback and output paths formed by the PNP and NPN complementary transistors 3, 4, 7, and 8 approximate class B operation. Moreover, when the static current is low, the cutoff frequency of the transistors 3, 4, 7, and 8 is reduced and the bias circuit 5, 6 becomes unstable because of temperature and source voltage fluctuations, with the result that the bandwidth of the circuit of FIG. 1 is reduced.

Consequently, the actual static current selected for the circuit of FIG. 1 is a compromise between the aforementioned extreme conditions. However, because the variations of the static current with gain are so large, as shown in FIG. 2, the range of appropriate values for the static current is rather narrow.

Furthermore, the aforementioned problems cannot be avoided when the static current is caused to vary because of changes in gain.

The present invention seeks to avoid the aforegoing problems, and instead provide a voltage control type gain control circuit in which the total static current is maintained substantially at a constant level regardless of any change in the gain of the circuit caused by the applied gain control voltage $V_c$.

A first preferred embodiment of this invention is shown in FIG. 3. As illustrated in that view, an input signal source 11, here shown as a current source, is coupled to an inverting input terminal of an operational amplifier 12, which is here configured as an error signal amplifier, and has its non-inverting input terminal grounded. The output terminal of the operational amplifier 12 is coupled through bias sources 13 and 14 to respective inputs of first and second differential amplifiers 21 and 22. Constant current sources 15 and 16 are respectively coupled to the differential amplifiers 21 and 22, and bias sources 17 and 18 are respectively coupled to control terminals thereof.

A load resistor 19 absorbs the output signal current $I_{out}$ therefrom.

The first differential amplifier 21 is formed of PNP transistors 23 and 24, whose emitters are commonly connected to the current source 15, and whose bases are respectively coupled to the bias sources 13 and 17. Similarly, the second differential amplifier is formed of a pair of NPN transistors 25 and 26 whose emitters are commonly coupled to the current source 16 and whose bases are respectively coupled to the bias sources 14 and 18. The collectors of the transistors 23 and 25 are grounded.

The bias sources 13, 14, 17, and 18 apply bias voltages $+V_B$ to the bases of the PNP transistors 23 and 24 and bias voltages $-V_B$ to the bases of the NPN transistors 25 and 26.

Further in the circuit of this invention is a first pair of transistors formed of a PNP feedback transistor 33 and a PNP output transistor 34, and a second pair of transistors formed of an NPN feedback transistor 35 and an NPN output transistor 36. The emitters of the transistors 33 and 34 are joined to each other and to the collector of a transistor 24 of the first differential amplifier 21. Similarly, the emitters of the transistors 35 and 36 of the second pair 32 are joined to each other and to the collector of the transistor 26 of the second differential amplifier 22.

The collectors of the feedback transistors 33 and 35 are joined together and are coupled through a feedback conductor 37 to the inverting input of the operational amplifier 12. The collectors of the output transistors 34 and 26 are joined together to the output load resistor 19. A pair of control signal inputs 38 and 39 are also provided with the input 38 coupled to the base of the output transistor 34 of the first pair 31 and to the base of the feedback transistor 35 of the second pair 32, and with the input 39 coupled to the base of the feedback transistor 33 of the first pair 31 and to the base of the output transistor 36 of the second pair 32.

In the voltage-control type gain control circuit as illustrated in FIG. 3, the output transistors 34 and 36 have respective collector-emitter currents $i_1$ and $i_2$, while the feedback transistors 33 and 35 have respective collector-emitter current $i_3$ and $i_4$. The transistors 24 and 26 have collector-emitter currents $i_5$ and $i_6$, while the transistors 23 and 25 have respective collector-emitter currents $i_7$ and $i_8$. The voltages at the emitters of the first and second pairs of transistors 31 and 32 are respectively expressed $v_1$ and $v_2$, while the voltage at the emitters of the transistors 23, 24 of the first differential amplifier and at the emitters of the transistors 25 and 26 of the second differential amplifier 22 are respectively expressed as $v_3$ and $v_4$. The voltage at the collectors of the transistors 23 and 25 (i.e., ground voltage) is expressed as $v_5$. The bias sources 13, 14, 17, and 18 each supply a bias voltage $V_B$.

Accordingly, the input current from the input signal source 11 can be expressed $$i_{in} = i_4 - i_3 \ldots \quad (12)$$

while the output current $i_{out}$ through the resistor 19 is expressed $$i_{out} = i_1 - i_2 \ldots \quad (13)$$

Further, the current $i_5$ flowing through the transistor 24 of the first differential amplifier 21 to the first transistor pair 31 is expressed $$i_5 = i_1 + i_3 \ldots \quad (14)$$

Likewise, the current $i_6$ flowing from the second transistor pair 32 and thence through the transistor 26 of the second differential amplifier 22 can be expressed $$i_6 = i_2 + i_4 \ldots \quad (15)$$

The saturation current through the transistors 24, 26, 33, 34, 35, and 36 are all equal to $I_S$, with the saturation current through the transistors 23 and 25 being set to a multiple thereof, $KI_S$ (where K is a constant). Here, the grounded-base current amplification factor $\alpha$ of all of the transistors 23, 24, 25, 26, 33, 34, 35, and 36 is assumed to be unity.

The output transistor 34 and the feedback transistor 35 of the first and second transistor pairs 31 and 32 can be assumed to be grounded, so that the gain control voltage $V_C$ is applied entirely to the bases of the feedback transistor 33 and output transistor 36. Consequently, the aforementioned currents $i_1 - i_4$ can be expressed as follows:

$$i_1 = I_S \left[ \exp\left(\frac{v_1}{V_T}\right) - 1 \right] \quad (16)$$

$$i_2 = I_S \left[ \exp\left(\frac{V_C - v_2}{V_T}\right) - 1 \right] \quad (17)$$

$$i_3 = I_S \left[ \exp\left(\frac{v_1 - V_C}{V_T}\right) - 1 \right] \quad (18)$$

$$i_4 = I_S \left[ \exp\left(-\frac{v_2}{V_T}\right) - 1 \right] \quad (19)$$

Where $V_T = kT/q$.

Substituting the equations (14) and (15) into the equations (16) to (19) yields $$i_5 = i_1 + i_3 \quad (20)$$

$$= I_S \left[ \exp\left(\frac{v_1}{V_T}\right) - 1 \right] + I_S \left[ \exp\left(\frac{V_1 - V_C}{V_T}\right) - 1 \right]$$

$$= I_S \left[ \exp\left(\frac{v_1}{V_T}\right) \left\{ 1 + \exp\left(-\frac{V_C}{V_T}\right) \right\} - 2 \right]$$

Consequently, $$\exp\left(-\frac{v_1}{V_T}\right) = \frac{(i_5/I_S) + 2}{1 + \exp(-V_C/V_T)} \quad (21)$$

Furthermore, $$i_6 = i_2, \quad (22)$$

$$= I_S \left[ \exp\left(\frac{V_C - v_2}{V_T}\right) - 1 \right] +$$

$$I_S \left[ \exp\left(-\frac{v_2}{V_T}\right) - 1 \right]$$

$$= I_S \left[ \exp\left(-\frac{v_2}{V_T}\right) \left\{ 1 + \exp\left(\frac{V_C}{V_T}\right) \right\} - 2 \right]$$

and, consequently, $$\exp\left(-\frac{v_2}{V_T}\right) = \frac{(i_6/I_S) + 2}{1 + \exp(V_C/V_T)} \quad (23)$$

Substituting the equations (20) and (22) into the equations (16) to (19) yields $$i_1 = (i_5 + 2I_S) \cdot \frac{1}{1 + \exp(-V_C/V_T)} \quad (24)$$

$$= (i_5 + 2I_S) \cdot \frac{A}{1 + A}$$

$$i_2 = (i_6 + 2I_S) \cdot \frac{\exp(V_C/V_T)}{1 + \exp(V_C/V_T)} \quad (25)$$

$$= (i_6 + 2I_S) \cdot \frac{A}{1 + A}$$

$$i_3 = (i_5 + 2I_S) \cdot \frac{\exp(-V_C/V_T)}{1 + \exp(-V_C/V_T)} \quad (26)$$

$$= (i_5 + 2I_S) \cdot \frac{1}{1 + A}$$

and $$i_4 = (i_6 + 2I_S) \cdot \frac{1}{1 + \exp(V_C/V_T)} \quad (27)$$

$$= (i_6 + 2I_S) \cdot \frac{1}{1 + A}$$

Here, the factor $A = \exp(V_C/V_T)$.

As a result, the net circuit gain G, equal to the ratio of the output current $i_{out}$ to the input current $i_{in}$, can be obtained by the substitution of the equation (24) to (27) into the equations (12) and (13) to yield $$G = \frac{i_1 - i_2}{i_4 - i_3} = -A = -\exp\left(\frac{V_C}{V_T}\right) \quad (28)$$

As is apparent from the foregoing the net current gain is an exponential function of the control voltage $V_C$. When there is a zero input signal, that is, when the input current $i_{in} = 0$, the static idling current $ID_{in}$ flowing from the transistor 33 into the transistor 35 can be expressed $ID_{in} = i_3 = i_4$. Consequently, the static current $ID_{in}$ can be expressed either by equation (26) or by equation (27). If the expressions $i_5 + 2I_S = i_6 + 2I_S = I_T$ during the absence of any input signal $i_{in}$, the static current $ID_{in}$ can be expressed $$ID_{in} = I_T \cdot \frac{1}{1 + A} \quad (29)$$

Further, at the time of the absense of any input signal, the output current $i_{out}$ is also equal to zero, and the static current $ID_{out}$ flowing from the transistor 34 into the transistor 36 can be expressed $ID_{out} = i_1 = i_2$, so that the equations (24) and (25) can be rewritten as $$ID_{out} = I_T \cdot \frac{A}{1 + A} \quad (30)$$

As is apparent, the sum of the equations (29) and (30) is a constant. That is, the sum of the static currents $ID_{in} + ID_{out}$ will have a constant value $I_T$ regardless of any change of the current gain A.

Figure 4:
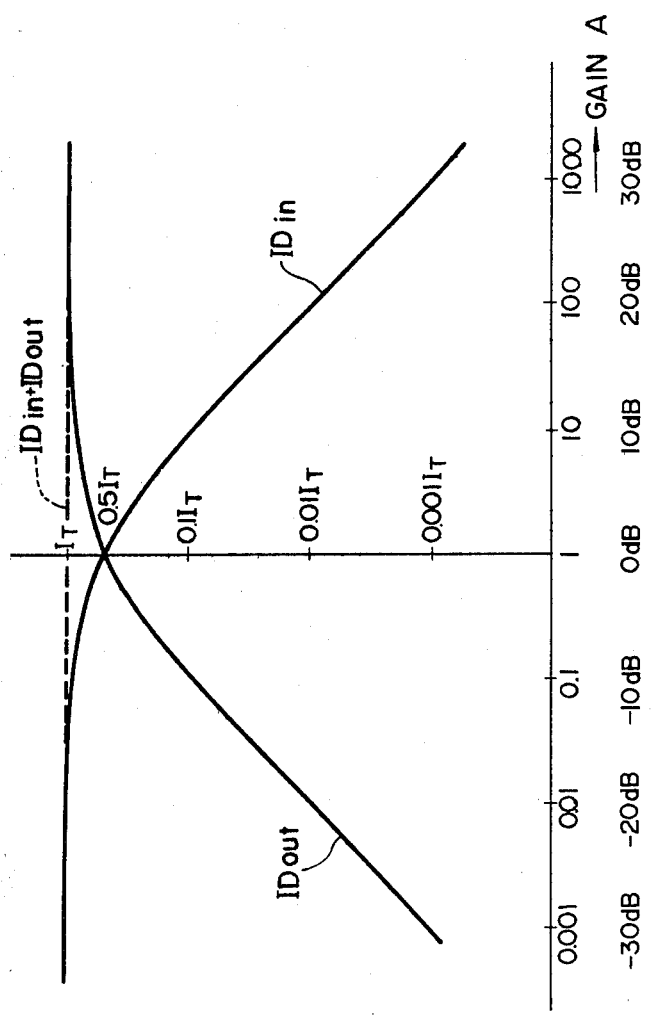
FIG. 4 is a graph showing the static current characteristics of the embodiment of FIG. 3.

As is shown in FIG. 4, where the static current $ID_{in}$ and $ID_{out}$ are represented with solid lines and the sum thereof is shown by a dashed line, the total static current $I_T$ has a flat plot with respect to changes in gain A. Normally, as the saturation current $I_S$ has a small value, the total static current $I_T$ is substantially equal to the collector current $i_5$ or $i_6$. Consequently, the total static current $I_T$ can be roughly expressed as a function of the current $I_O$ supplied from the constant current sources 15 and 16 to the first and second differential amplifiers 21 and 22, and as a function of the saturation current ratio K of the various component transistors:

$$I_T = \frac{I_0}{1 + K} \quad (31)$$

The value of the current $I_O$ from the constant current sources 15 and 16 is selected in accordance with the maximum values of the input current $i_{in}$ and the output current $i_{out}$. Consequently, the total static current $I_T$ is determined by the selection of the saturation current ratio K.

Because, in the voltage control type gain control circuit of this invention, the static current is held constant regardless of the gain A, it is possible to select the optimum static current which will avoid any of the above mentioned drawbacks which occur when the static current is selected too high or too low. Thus, it is possible to achieve a wide-band frequency characteristic by minimizing the reduction of the cut-off frequency of any of the transistors. It is also possible to increase the control range of the circuit with satisfactory linearity of the control characteristic, and thereby to reduce any distortion in the linearity of the input/output characteristic thereof. Furthermore, the gain control circuit of this invention reduces any feed-through of the control voltage signal $V_C$, minimizes any shot noise or other random noise, and suppresses the generation of crossover distortion in the vicinity of the zero crossings of the input signal $i_{in}$. Additionally, the total static current $I_T$ can be selected sufficiently high so that the voltage sources 15 and 16 will provide a reliable steady current and the bias sources 13, 14, 17, and 18 will provide reliable steady bias voltages regardless of temperature and source voltage fluctuations.

Figure 5:
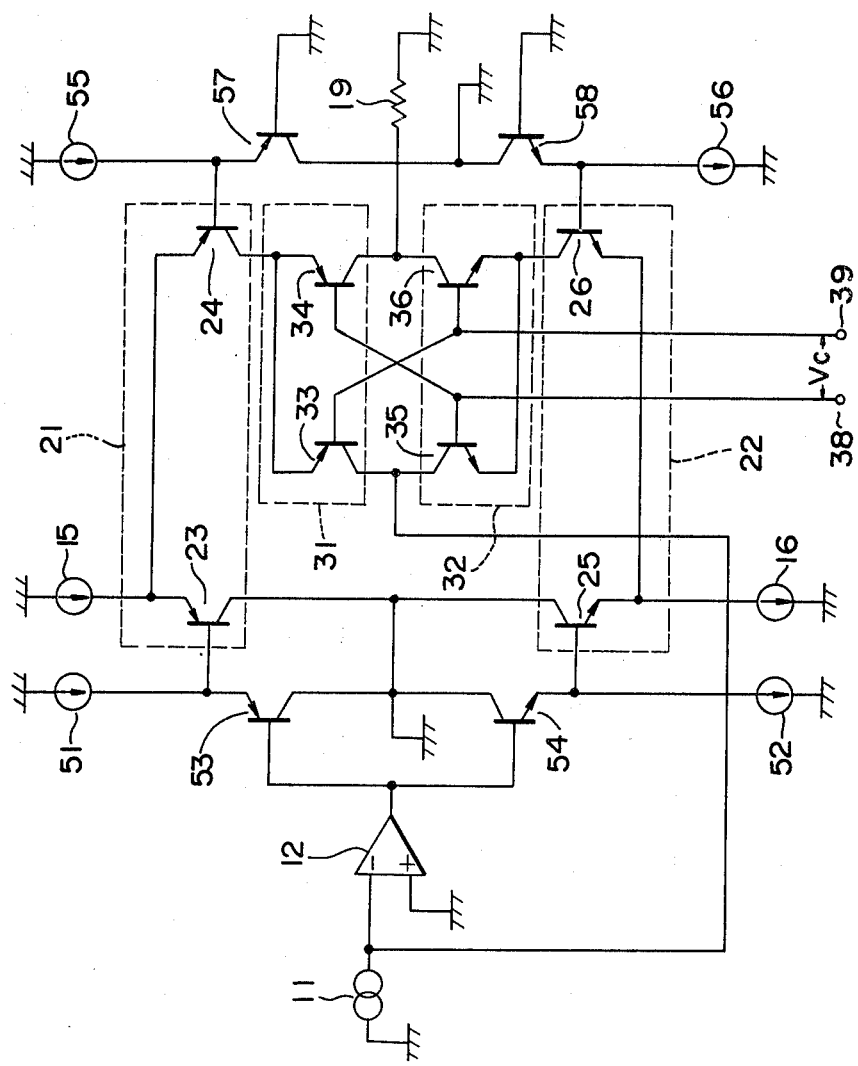
FIG. 5 is a circuit diagram showing a second embodiment of the present invention.

FIG. 5 shows a second embodiment of the gain control circuit of this invention. This embodiment is, in fact, a practical version of the embodiment of FIG. 3. In FIG. 5, elements and parts in common with corresponding elements of FIG. 3 are identified with the same reference numbers, and a detailed description thereof is omitted.

In the second embodiment, the bias sources 13 and 14 are replaced by a series circuit formed of current sources 51 and 52, a PNP transistor 53, and an NPN transistor 54. The emitter of the transistor 53 is connected to the current source 51 and also to the base of the transistor 23 of the differential amplifier 21. Similarly, the emitter of the transistor 54 is connected to the current source 52 and to the base of the transistor 25 of the differential amplifier 22. The collectors of the transistors 53 and 54 are each connected to ground, and the bases of the transistors 53 and 54 are each connected to the output terminal of the operational amplifier 12.

The bias sources 17 and 18 are replaced by a series circuit formed of current sources 55 and 56, a PNP transistor 57 and NPN transistor 58. Here the transistors 57 and 58 are connected in a diodic arrangement, with their collectors and bases each connected to ground. The emitter of the transistor 57 is connected to the current source 55 and to the base of the transistor 24 of the first differential amplifier 21. Similarly, the emitter of the transistor 58 is connected to the current source 56 and to the base of the transistor 26 of the second differential amplifier 22.

It will be understood that the transistors 53 and 54 will provide a substantially constant voltage difference between their respective emitters and bases. Similarly, the diodic transistors 57 and 58 will also provide a substantially constant voltage difference between their respective emitters and ground.

The method of establishing the static current $I_T$ in the embodiment of FIG. 5 can be explained as follows.

As in the previous embodiment of FIG. 3, the constant K for establishing the static current $I_T$ has been defined to be the saturation current ratio of the transistors 34 and 36 to the transistors 24 and 26 of the first and second differential amplifiers 21 and 22. Thus, the voltages of the bias voltage sources 13, 14, 17, and 19 of FIG. 3 are assumed to be identical. The value of K actually attained in the equation (31) normally ranges from unity to several dozens, and is actually determined by any of several conditions which can affect the biasing of the transistors 24, 26, 34, and 36.

However, it is also possible to establish the value of K in a range of one to five by selection of the saturation current ratio of the transistor 34 and 36 to the transistors 24 and 26. In a practical integrated circuit, K is determined by the ratio of the effective emitter areas. However, when K exceeds about ten, the simple saturation current ratio alone requires excessive transistor area, thus increasing the chip area required for the integrated circuit. This problem can be resolved by providing an offset voltage between the bias voltage sources 13 and 14 and between the sources 17 and 18. In the embodiment of FIG. 5, this is achieved by the use of the transistors 53, 54, 57, and 58.

More particularly, the emitter current density of the transistors 53 and 54, which are coupled between the bases of the transistors 23 and 25, is set to be lower than the emitter current density of the transistors 55 and 58, which are connected to the bases of the other transistors 24 and 26. For this reason, the saturation current of the transistors 53 and 54 can be set relatively high as compared to that of the transistors 57 and 58. Alternatively, the current of the constant current sources 55 and 56 can be set higher than that of the constant currents sources 51 and 52.

The constant K in the equation (31) corresponds to the current distribution ratio of the transistors 23 and 25 in the first and second differential amplifiers 21 and 22 to the other transistors 24 and 26 of the differential amplifiers 21 and 22. If the saturation current ratio of the transistors 23 and 25 to the other transistors 24 and 26 is denoted as a constant $K_1$, while the saturation current ratio of the transistors 57 and 58 to the transistors 53 and 54 is denoted as another constant $K_2$, and the current ratio of the constant current sources 55 and 56 to the constant current sources 51 and 52 is denoted as yet another constant $K_3$, the current distribution ratio, denoted as $K_0$, can be substantially established as $$K_0 = K_1 \cdot K_2 \cdot K_3 \tag{32}$$

As the current distribution ratio $K_0$ is a product of three factors, it is possible to attain a ratio $K_0$ of the order of one hundred by setting the individual factors thereof $K_1$, $K_2$, and $K_3$ at values of five or less.

The remaining construction of the second embodiment is substantially the same as that of the first embodiment shown in FIG. 3.

As a consequence of the above defined construction, the second embodiment not only permits the results of the first embodiment to be achieved, but also provides circuit construction well suited for implementation as a semiconductor integrated circuit, as steady bias voltage sources are realized without great difficulty by using the voltage drops across the PN junctions of the transistor 53, 54, 57, and 58.

Figure 6:
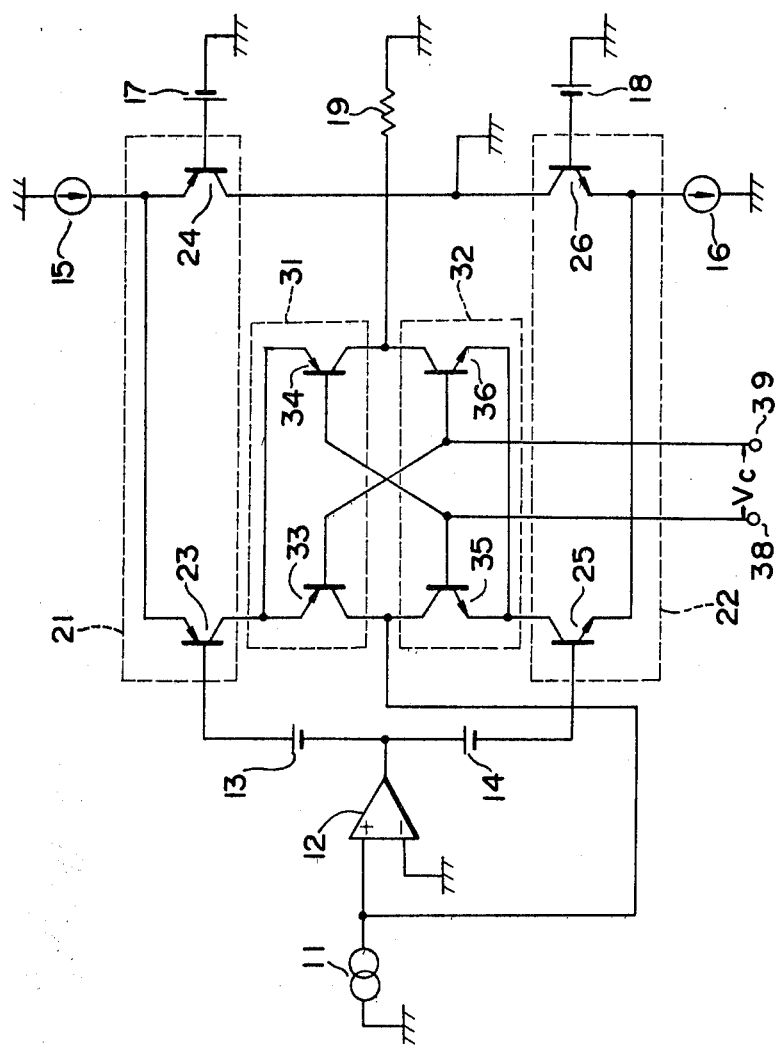
FIG. 6 is a circuit diagram showing a third embodiment of the present invention.

FIG. 6 illustrates a third embodiment of the gain control circuit of this invention. In the third embodiment, elements which are common to the previous embodiments are identified with the same reference numerals, and a detailed description thereof is omitted.

In the third embodiment, the non-inverting input terminal of the operational amplifier 12 is coupled to the signal source 11 and to the feedback conductor 37, while the inverting input thereof is coupled to ground. Also, unlike the foregoing embodiments, the emitters of the first pair of transistors 31 are connected to the collector of the transistor 23 and the emitters of the second pair of transistors 32 are connected to the collector of the transistor 25. The collectors of the transistors 24 and 26 of the first and second differential amplifiers are connected to ground. In this embodiment, as in that of FIG. 5, it is possible to use the base emitter voltages of transistors in lieu of the bias voltage sources 13, 14, 17, and 18.

Figure 7:
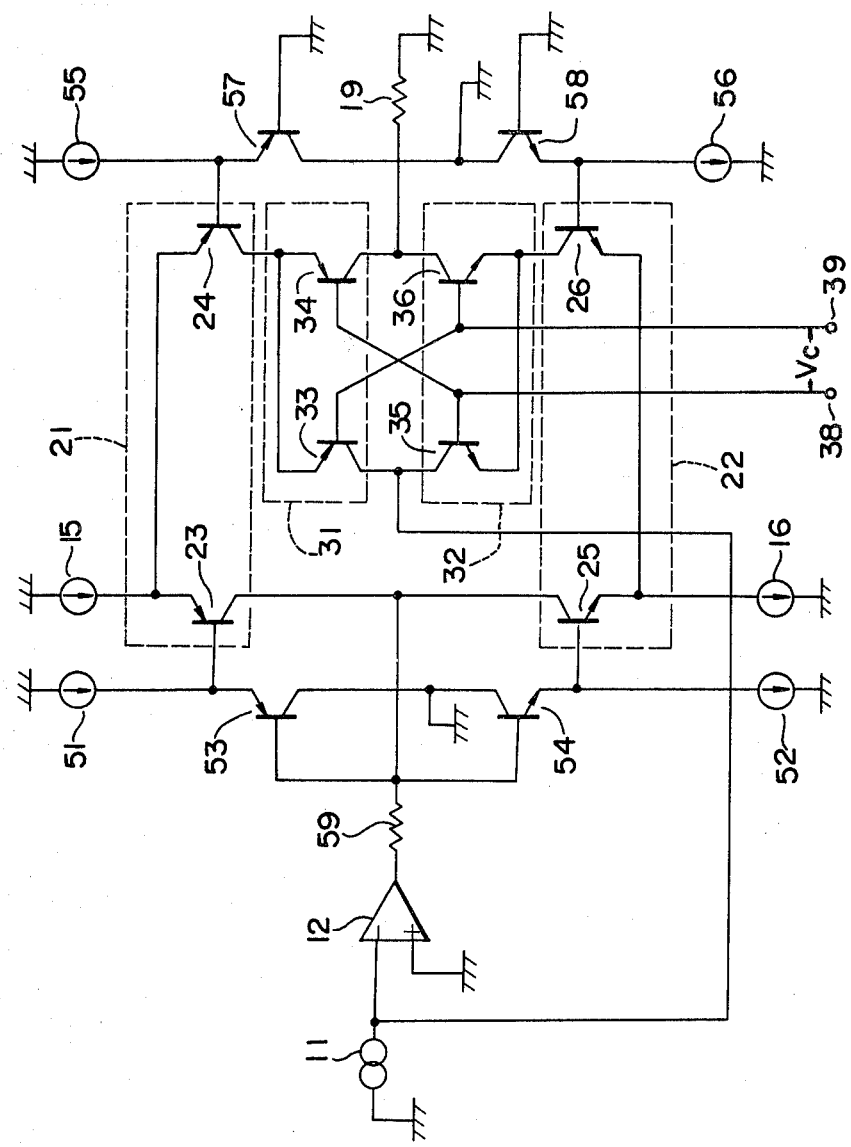
FIG. 7 is a circuit diagram showing a fourth embodiment of the present invention.

FIG. 7 illustrates a fourth embodiment of this invention. In FIG. 7, elements in common with the embodiment of FIG. 5 are identified with the same reference numerals, and a detailed description thereof is omitted. In this embodiment, a resistor 59 is included between the output terminal of the operational amplifier 12 and the bases of the transistor 53 and 54. Also in this embodiment, the collectors of the transistors 23 and 24 of the first and second differential amplifiers 21 and 22 are connected to the resistor 59, rather than to ground. Thus, here the collector current of the transistors 23 and 25 is fed back to the transistors 53 and 55 which serve as the input side bias voltage sources for the first and second differential amplifiers 21 and 22. The resistor 59 and the connection of the collectors of the transistors 23 and 25 to the bases of the transistors 53 and 54 ensures that the transfer characteristic at the output terminal of the operational amplifier 12 is linearized. Thus, the output voltage of the operational amplifier 12 will vary linearly with the input current applied from the input source 11. Of course, the previous embodiments, such as the third embodiment (FIG. 6), could be similarly adapted.

Figure 8:
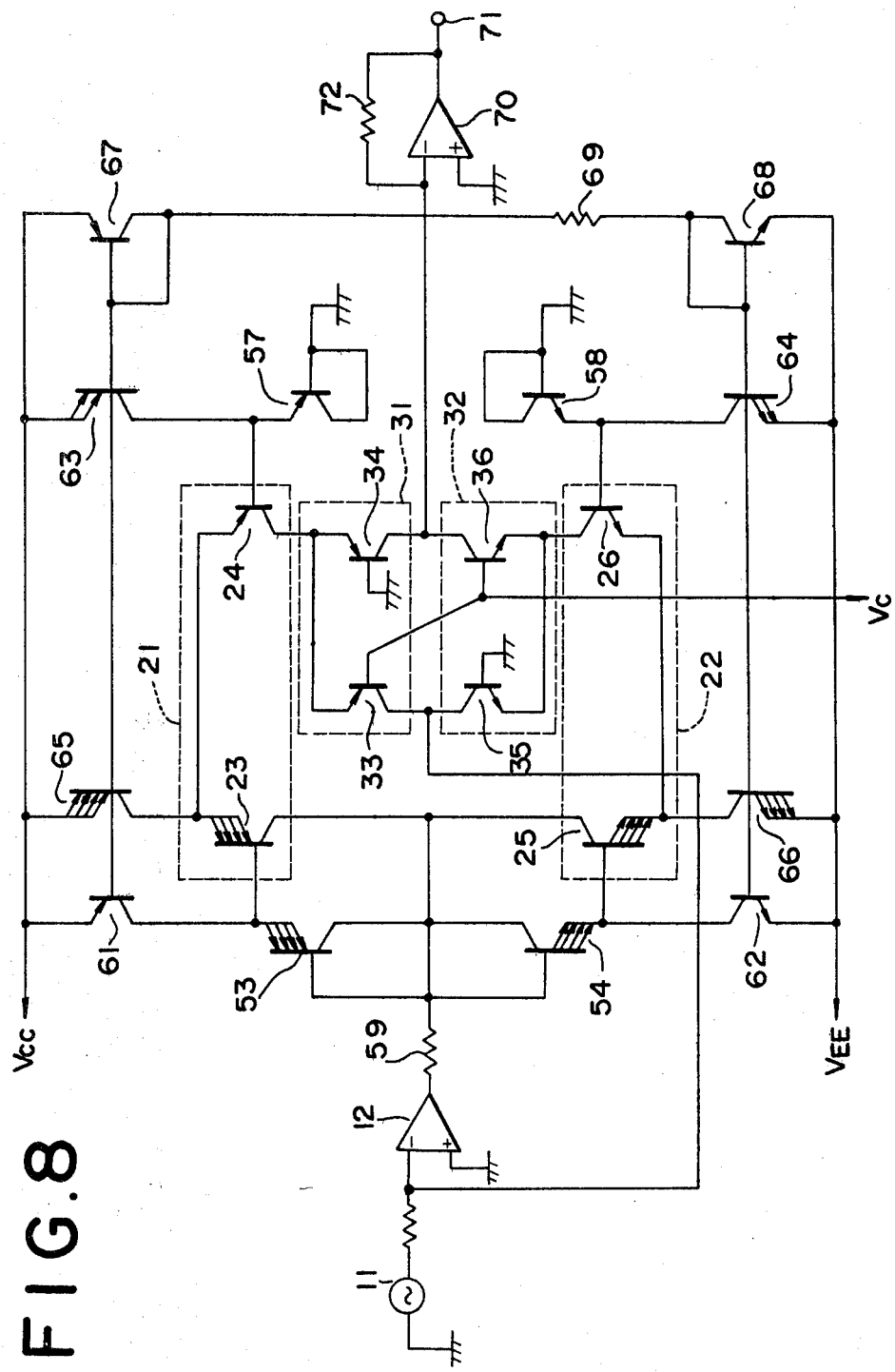
FIG. 8 is a circuit diagram showing a fifth embodiment of the present invention.

FIG. 8 illustrates a fifth embodiment of the gain control circuit of this invention. FIG. 8 particularly shows a specific circuit construction of a circuit of this invention well suited for integration as semiconductor integrated circuit. In FIG. 8, elements in common with the embodiment of FIG. 7 are identified with the same reference numerals, and a detailed description thereof is omitted.

In this embodiment, multi-emitter transistors are used as the transistor 23 and 25 of the first and second differential amplifiers 21 ans 22, so that the current distribution ratio is established by making the saturation current of the transistors 23 and 25 higher than that of the other transistors 24 and 26. For example, with four-emitter transistors, as shown, for transistors 23 and 25, the saturation current through the transistors 23 and 25 is substantially four times that through the single-emitter transistors 24 and 26. Thus, the constant $K_1$ of the equation (32) is set at 4. Also in this embodiment, four-emitter transistors are used as the transistors 53 and 54 which serve as the base bias voltage sources for the transistors 23 and 25. Therefore, the constant $K_2$ of the equation (32) is also set at 4. Further, in this embodiment the constant $K_3$ of equation (32) is set at 2 by establishing the emitter current through the transistors 53 and 54 to be one half that passing through the transistors 57 and 58. This is achieved by using multi-emitter transistors as constant current sources, for example, in the construction shown in FIG. 8 which will now be discussed.

In FIG. 8, transistors 61 and 62 provide current sources for the transistors 53 and 54, respectively. The transistors 61 and 62 have their emitters respectively coupled to a positive voltage $V_{CC}$ and to a negative voltage $V_{EE}$ and have their collectors coupled to the emitters of the transistors 53 and 54. Similarly, two-emitter transistors 63 and 64 extend between the voltage sources $V_{CC}$, $V_{EE}$ and the emitters of the transistors 57 and 58, respectively. Four-emitter transistors 65 and 66 extend between the voltage sources $V_{CC}$, $V_{EE}$ and the emitters of the transistors 23 and 25, respectively. A series circuit formed of diode-arranged transistors 67 and 68 whose collectors are coupled by a series resistor 69 provide bias voltages to the transistors 61, 63, and 65 and to the transistors 62, 64, and 66. As can be readily understood from the foregoing discussion, the emitter current through the transistors 57 and 58 is twice that through the transistors 53 and 54 because the transistors 63 and 64 have twice the emitter area as the transistors 61 and 62.

As a consequence, in the fifth embodiment, the constant $K_0$ of equation (32) is established substantially at thirty-two. Here, the four-emitter transistors 65 and 66, which serve as current source and current sink for the emitters of the first and second differential amplifiers 21 and 22, are provided to furnish a greater amount of collector current to the differential amplifiers 21 and 22.

Also in this embodiment, a current-to-voltage converter is coupled to the collectors of the output transistors 34 and 36. The current-to-voltage converter includes an operational amplifier 70 having a ground non-inverting input terminal, and inverting input terminal coupled to the collectors of the transistors 34 and 36, and an output terminal connected to a circuit output 71. A feedback resistor 72 is connected between the output terminal of the operational amplifier 70 and the inverting input terminal thereof.

While in this embodiment four-emitter transistors 23, 25, 53, 54, 65, and 66 and two-emitter transistors 63 and 64 are used, it is also possible to use multi-emitter transistors arranged in various other configurations to establish a desired value of the constant $K_0$.

Figure 9:
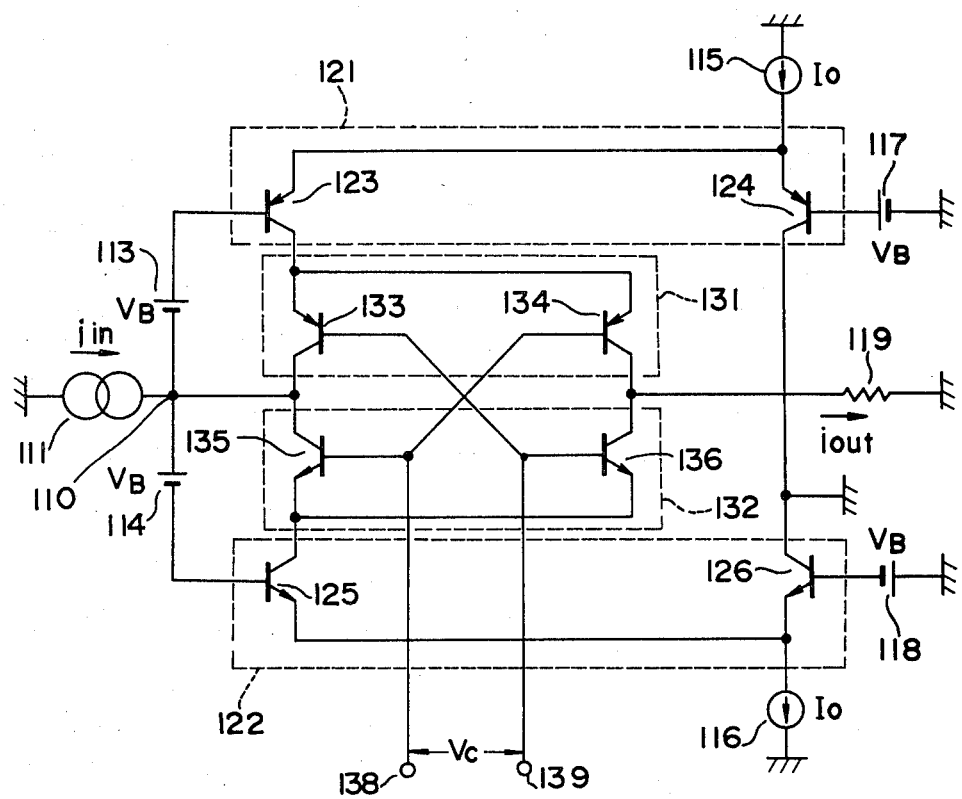
FIG. 9 is a circuit diagram showing a sixth embodiment of the present invention.
Figure 10:
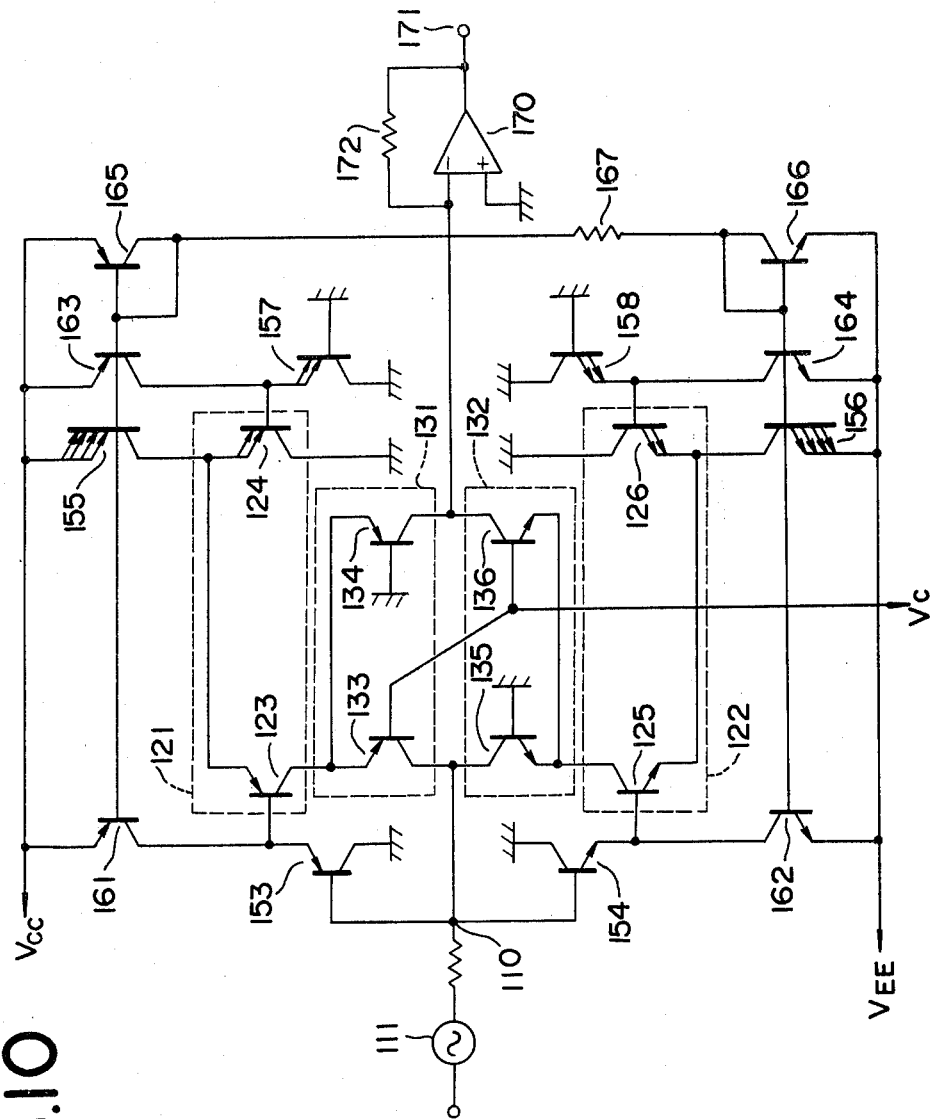
FIG. 10 is a circuit diagram showing a seventh embodiment of the present invention.

FIGS. 9 and 10 show further embodiments of this invention, in which the operational amplifier 12, as used in the first through fifth embodiment, is omitted.

In the sixth embodiment as shown in FIG. 9, elements in common with the previous embodiments are identified with similar reference numberals, but raised by 100, and a detailed description thereof will be omitted. In the sixth embodiment, the input signal source 111 is connected to an input point 110 which is connected through the first and second bias voltage sources 113 and 114 to the bases of the transistors 123 and 125 of the first and second differential amplifiers 121 and 122. Similar to the third embodiment (FIG. 6), the collectors of the transistors 123 and 125 of the differential amplifiers 121 and 122 are coupled jointly to the emitters of the transistors 133 and 134 of the first transistor pair 131 while the collector of the transistor 125 of the second differential amplifier 122 is jointly coupled to the emitters of the transistors 135 and 136 of the second pair 132. The collectors of the other transistors 124 and 126 of the first and second differential amplifiers 121 and 122 are both coupled to ground. The feedback conductor 137 couples the collectors of the feedback transistors 133 and 135 to the input point 110, while the load resistor 119 extends between the collectors of the output transistors 134 and 136 and ground.

The embodiment of FIG. 9, which omits the operational amplifier 12, is highly suited for applications in which the cost of the device is to be minimized.

A seventh embodiment of the invention is illustrated in FIG. 10. Elements in common with the previous embodiments are identified with the same reference characters, but raised by 100 and a detailed description thereof is omitted. The seventh embodiment is a practical version of the embodiment of FIG. 9, and incorporates multi-emitter bias elements and current sources as in the fifth embodiment (FIG. 8). The embodiment of FIG. 10 is well suited for integration as a semiconductor integrated circuit.

In this embodiment, the transistors 124 and 126 of the differential amplifiers 121 and 122 are constructed as two-emitter transistors, and the diode-connected bias transistors 157 and 158 are also constructed as two-emitter transistors.

The ratio $K_1$ of the current through the transistors 124 and 126 to the current to the transistors 123 and 125 is established by the use of the multi-emitter transistors 124 and 126, and by the use of the multi-emitter transistors 157 and 158 to provide bias voltage thereto. The constant $K_0$ of equation (32) can be readily determined by the construction of the various transistors hereof as multi-emitter transistors.

Thus, the output voltage at the terminal 171 will vary according to the input current from the source 111, and the gain of the circuit will vary exponentially with the control voltage $V_C$ applied between the bases of the transistors 133, 136 and the bases of the transistors 134, 135.

Having described specific preferred embodiments of this invention with reference to the accompanying drawings, it is to be understood that the invention is not limited to those precise embodiments, and that various changes and modifications may be effected therein by one skilled in the art without departing from the scope or spirit of the invention as defined in the appended claims.

We claim:
1. A gain control circuit comprising
input means receiving an input signal;
first differential amplifier means having an input coupled to said input means and first and second differential output terminals;
second differential amplifier means having an input coupled to said input means and first and second differential output terminals;
a first pair of transistors of one conductivity type having emitters coupled together to the first differential output terminal of said first differential amplifier and also having respective bases and collectors;
a second pair of transistors having an opposite conductivity type in respect to said first pair, having emitters coupled together to the first differential output terminal of said second differential amplifier means, having respective collectors coupled so that the collector of one transistor of the first pair is coupled to the collector of one transistor of the second pair and the collector of the other transistor of the first pair is coupled to the collector of the other transistor of the second pair, and having respective bases coupled so that the base of the one transistor of each pair is coupled to the other transistor of the remaining pair;

feedback means coupling the collectors of said one transistors to said input means;

means coupling the second differential amplifier means to a common reference point;

output means coupled to the collectors of the other transistors of said first and second pairs; and control input means coupled to apply a control voltage between the bases of the transistors of each of the first and second pairs thereof.

2. A gain control circuit according to claim 1, wherein said first differential amplifier means includes a pair of transistors of the one conductivity type and having respective emitters coupled together, bases, one of which provides said input thereof, and collectors providing said first and second differential outputs thereof; and wherein said second differential amplifier means includes a pair of transistors of the opposite conductivity type having respective emitters coupled together, bases, one of which provides said input thereof, and collectors providing said first and second differential outputs thereof; and said gain control circuit further comprises means biasing the others of the bases to predetermined levels, and means causing a constant current to flow from the emitters of said first differential amplifier means to the emitters of said second differential amplifier means.

3. A gain control circuit according to claim 2, wherein said means causing a constant current to flow includes a first constant current source coupled to the emitters of said first differential amplifier means and a second constant current source coupled to the emitters of said second differential amplifier means.

4. A gain control circuit according to claim 2, wherein each said constant current source includes a transistor having a collector coupled to the emitters of the respective differential amplifier means, a plurality of emitters ganged together to a voltage source, and a base, and biasing means coupled to such base.

5. A gain control circuit according to claim 2, wherein said input means includes an error amplifier connected to receive said input signal, and having an output coupled to the input of each said differential amplifier means and means coupling said feedback means thereto.

6. A gain control circuit according to claim 5, wherein said input means further includes a linearizing impedance disposed between the output of the error amplifier and the inputs of both said first and second differential amplifier means.

7. A gain control circuit according to claim 2, wherein the respective transistor of each of said first and second differential amplifier means whose base provides said input thereof provides its collector as said first differential output terminal.

8. A gain control circuit according to claim 7, wherein said input means includes an operational amplifier having a non-inverting input terminal coupled to receive said input signal and also coupled to said feedback means, an inverting input terminal coupled to said common reference point, and an output terminal coupled to the inputs of said first and second differential amplifier means.

9. A gain control circuit according to claim 2, wherein the respective transistor of each of said first and second differential amplifier means whose base provides said input thereof provides its collector as said second differential output terminal.

10. A gain control circuit according to claim 9, wherein said input means includes an operational amplifier having an inverting input terminal coupled to receive said input signal and also coupled to said feedback means, a non-inverting input terminal coupled to said common reference point, and an output terminal coupled to the inputs of said first and second differential amplifier means.

11. A gain control circuit according to claim 10, wherein said input means further includes a linearizing resistor disposed between said output terminal and said inputs of said first and second differential amplifier means.

12. A gain control circuit according to claim 1, wherein said input means includes an operational amplifier having an inverting input terminal and a non-inverting input terminal, one of which is coupled to receive the input signal and is also coupled to said feedback means, the other of which is coupled to said common reference point, and an output terminal coupled to the inputs of said first and second differential amplifier means.

13. A gain control circuit according to claim 12, wherein said input means further includes first and second biasing means respectively disposed between the output terminal of said operational amplifier and the inputs of said first and second differential amplifier means to maintain substantially a constant voltage difference respective therebetween.

14. A gain control circuit according to claim 13, wherein said first and second biasing means each include a transistor having an emitter coupled to the input of the respective differential amplifier means, a base coupled to the output terminal of said operational amplifier, and a collector coupled to said common reference point.

15. A gain control circuit according to claim 14, wherein the transistors of said first and second biasing means are of complementary conductivity types, and said first and second biasing means each further include a constant current source coupled to the emitter of the respective transistor thereof.

16. A gain control circuit according to claim 1, wherein said output means includes a current-to-voltage converter having an input coupled to the collectors of said other transistors and an output providing a gain-controlled signal.

17. A gain control circuit according to claim 16, wherein said current-to-voltage converter includes an operational amplifier having an input terminal as said input thereof, an output terminal as said output thereof, and a feedback impedance bridging said input and output terminals.

* * * * *